United States Patent
Weiser et al.

(10) Patent No.: US 9,281,000 B2
(45) Date of Patent: *Mar. 8, 2016

(54) PHOTOPOLYMER FORMULATION FOR PRODUCING VISIBLE HOLOGRAMS

(75) Inventors: Marc-Stephan Weiser, Leverkusen (DE); Thomas Rölle, Leverkusen (DE); Friedrich-Karl Bruder, Krefeld (DE); Thomas Fäcke, Leverkusen (DE); Dennis Hönel, Zülpich (DE)

(73) Assignee: Covestro Deutschland AG, Leverkusen (DE)

(*) Notice: Subject to any disclaimer, the term of this patent is extended or adjusted under 35 U.S.C. 154(b) by 772 days.

This patent is subject to a terminal disclaimer.

(21) Appl. No.: 13/071,713

(22) Filed: Mar. 25, 2011

(65) Prior Publication Data

US 2011/0236803 A1 Sep. 29, 2011

(30) Foreign Application Priority Data

Mar. 29, 2010 (EP) .................................... 10158100

(51) Int. Cl.
- G03H 1/02 (2006.01)
- G11B 7/24044 (2013.01)
- G03F 7/00 (2006.01)
- G03F 7/031 (2006.01)

(52) U.S. Cl.
CPC ............ *G11B 7/24044* (2013.01); *G03F 7/001* (2013.01); *G03F 7/031* (2013.01); *G03H 1/02* (2013.01); *G03H 2001/0264* (2013.01); *G03H 2260/12* (2013.01)

(58) Field of Classification Search
None
See application file for complete search history.

(56) References Cited

U.S. PATENT DOCUMENTS

| | | | |
|---|---|---|---|
| 3,631,155 A * | 12/1971 | smiley | 525/61 |
| 3,652,275 A | 3/1972 | Baum et al. | |
| 3,658,526 A * | 4/1972 | Haugh | 430/1 |
| 4,917,977 A | 4/1990 | Smothers | |
| 4,942,112 A * | 7/1990 | Monroe et al. | 430/282.1 |
| 4,963,471 A | 10/1990 | Trout et al. | |
| 5,470,813 A | 11/1995 | Le-Khac | |
| 5,747,629 A * | 5/1998 | Yeske et al. | 528/70 |

(Continued)

FOREIGN PATENT DOCUMENTS

| EP | 0700949 A2 | 3/1996 |
|---|---|---|
| EP | 0743093 A1 | 11/1996 |

(Continued)

OTHER PUBLICATIONS

Smothers, et al., "Photopolymers for holography", Proc. SPIE, vol. 1212, pp. 20-29 (1990).*

(Continued)

*Primary Examiner* — Martin Angebranndt
(74) *Attorney, Agent, or Firm* — Drinker Biddle & Reath LLP (57) ABSTRACT

The present invention relates to a photopolymer formulation containing chemically crosslinked matrix polymers, writing monomers and a photoinitiator system, wherein the photoinitiator system contains a HABI, a dye attuned to the HABI and having an absorption maximum in the range of 400-800 nm and a hydrogen donor. The present invention further relates to a process for producing exposed holographic media with the above photopolymer formulation.

12 Claims, 1 Drawing Sheet

(56) References Cited

U.S. PATENT DOCUMENTS

| | | | |
|---|---|---|---|
| 6,403,702 B1* | 6/2002 | Markusch et al. | 524/590 |
| 7,008,900 B1 | 3/2006 | Hofmann et al. | |
| 7,879,509 B2* | 2/2011 | Stokel et al. | 430/2 |
| 2002/0142227 A1* | 10/2002 | Dhar et al. | 430/1 |
| 2003/0087104 A1* | 5/2003 | Dhar et al. | 428/422.8 |
| 2005/0084807 A1* | 4/2005 | Meagley et al. | 430/464 |
| 2005/0161645 A1* | 7/2005 | Cheben et al. | 252/586 |
| 2006/0057467 A1* | 3/2006 | Takizawa | 430/1 |
| 2006/0194122 A1* | 8/2006 | Takizawa | 430/1 |
| 2008/0102378 A1* | 5/2008 | Cole et al. | 430/2 |
| 2008/0312403 A1* | 12/2008 | Stockel et al. | 528/59 |
| 2010/0086860 A1* | 4/2010 | Roelle et al. | 430/2 |
| 2010/0086861 A1* | 4/2010 | Weiser et al. | 430/2 |
| 2010/0087564 A1* | 4/2010 | Weiser et al. | 522/95 |
| 2010/0112459 A1* | 5/2010 | Weiser et al. | 430/2 |
| 2010/0203241 A1* | 8/2010 | Weiser et al. | 427/162 |
| 2012/0214089 A1* | 8/2012 | Honel et al. | 430/2 |
| 2012/0214090 A1* | 8/2012 | Weiser et al. | 430/2 |
| 2012/0214895 A1* | 8/2012 | Rolle et al. | 522/78 |
| 2012/0214900 A1* | 8/2012 | Klee et al. | 523/116 |
| 2012/0219883 A1* | 8/2012 | Bruder et al. | 430/2 |
| 2012/0219884 A1* | 8/2012 | Weiser et al. | 430/2 |
| 2012/0231376 A1* | 9/2012 | Rolle et al. | 430/2 |
| 2012/0231377 A1* | 9/2012 | Weiser et al. | 430/2 |
| 2012/0237856 A1* | 9/2012 | Rolle et al. | 430/2 |

FOREIGN PATENT DOCUMENTS

| | | | |
|---|---|---|---|
| EP | 0761708 A2 | | 3/1997 |
| JP | 2003-302726 | * | 10/2003 |
| WO | WO-97/40086 A1 | | 10/1997 |
| WO | WO-98/16310 A1 | | 4/1998 |
| WO | WO-00/47649 A1 | | 8/2000 |
| WO | WO-2008/125229 A1 | | 10/2008 |

OTHER PUBLICATIONS

Wypych, Handbook of Plasticizers, Chapter 2, pp. 7-71 (2004).*

Dessauer, R., "The Invention of Dylux® Instant-Access Imaging Materials and the Development of HABI Chemistry—A Personal History," Advances in Photochemistry, 2005, vol. 28, pp. 129-261.

Hariharan, P., "Optical Holography," 2nd Ed., Cambridge University Press, 1996, pp. 48-63.

Kogelnik, H., "Coupled Wave Theory for Thick Hologram Gratings," The Bell System Technical Journal, 1969, vol. 48, No. 9, pp. 2909-2947.

Ng, W. W., et al., "Holographic Interference Lithography for Integrated Optics," IEEE Transactions on Electron Devices, 1978, vol. ED-25, No. 10, pp. 1193-1200.

* cited by examiner

PHOTOPOLYMER FORMULATION FOR PRODUCING VISIBLE HOLOGRAMS

CROSS-REFERENCE TO RELATED APPLICATIONS

This application claims benefit to European Patent Application No. 10158100.7, filed Mar. 29, 2010, which is incorporated herein by reference in its entirety for all useful purposes.

BACKGROUND OF THE INVENTION

The invention relates to a photopolymer formulation comprising chemically crosslinked matrix polymers, writing monomers and a photoinitiator system, to the use of the photopolymer formulation for producing holographic media and also to a process for producing exposed holographic media.

WO 2008/125229 A1 describes photopolymer formulations of the type mentioned at the beginning. They comprise chemically crosslinked polyurethane-based matrix polymers, acrylic-based writing monomers, and also a photoinitiator system.

Media formed from the known photopolymer formulation can be exposed to electromagnetic radiation to form holograms therein. However, the application primarily describes formulations for data storage applications wherein the holograms are produced using laser light in the ultraviolet region. The holograms obtained are difficult or impossible to see with the naked eye. It does not describe formulations yielding bright holograms which are readily and directly perceivable by the human eye.

To produce bright and easily visible holograms, it is generally desirable to seek a high refractive index difference $\Delta n$ and a low thickness d for the medium while maximizing the diffraction efficiency DE. That is, increasing $\Delta n$ increases the latitude to engineer the layer thickness without incurring a loss of DE. Therefore, the optimization of $\Delta n$ in the production of photopolymer formulations for bright, visible holograms is of outstanding importance (P. Hariharan, Optical Holography, 2nd Edition, Cambridge University Press, 1996).

It is an object of the present invention to provide a photopolymer formulation into which bright holograms quickly and simply perceivable by the unaided human eye can be exposed.

Embodiments of the Invention

An embodiment of the present invention is a photopolymer formulation comprising chemically crosslinked matrix polymers, writing monomers and a photoinitiator system, wherein the photoinitiator system comprises a HABI, a dye attuned to the HABI and having an absorption maximum in the range of 400-800 nm, and a hydrogen donor.

Another embodiment of the present invention is the above formulation, wherein the HABI is a compound of formula (I)

where

R$^1$, R$^4$ represent, independently of one another, a substituent selected from the group consisting of a chlorine radical, a methoxy radical, and an ethoxy radical; and R$^2$, R$^3$, R$^5$, R$^6$ represent, independently of one another, a substituent selected from the group consisting of one or more hydrogen, chlorine, methoxy, and ethoxy radicals.

Another embodiment of the present invention is the above formulation, wherein R$^2$, R$^3$, R$^5$, R$^6$ are each a hydrogen radical.

Another embodiment of the present invention is the above formulation, wherein the hydrogen donor is selected from the group consisting of alkylamine, alkylaminoalcohol, substituted glycine ester, aromatic thiol, aliphatic thiol, aromatic amine, aliphatic amine, aromatic disulphide, benzylic disulphide, aromatic diselenide, and benzylic diselenide.

Another embodiment of the present invention is the above formulation, wherein the hydrogen donor is selected from the group consisting of 2-mercapto-1-methylimidazole, 1-phenyl-1H-tetrazole-5-thiol, mercaptobenzothiazole, phenyl disulphide, dodecanethiol, 2(3H)-benzoxazolethione, 1H-1,2,4-triazole-3-thiol, 5,5'-dithiobis-1-phenyl-1H-tetrazole, 1-methyl-1H-tetrazole-5-thiol, 5-methyl-1,3,4-thiadiazole-2-thiol, N-phenylglycine ethyl ester, and N-phenylglycine methyl ester.

Another embodiment of the present invention is the above formulation, wherein the chemically crosslinked matrix polymers are polyurethanes.

Another embodiment of the present invention is the above formulation, wherein the writing monomers comprise a mono- and/or a multifunctional writing monomer.

Another embodiment of the present invention is the above formulation, wherein the mono and/or multifunctional writing monomer comprises a mono- and/or a multifunctional acrylate.

Another embodiment of the present invention is the above formulation, wherein the acrylate has the general formula (III)

where
m represents an integer from 1 to 4; and
$R^7$, $R^8$ represent, independently of one another, a substituent selected from the group consisting of hydrogen, a linear organic radical, a branched organic radical, a cyclic organic radical, and a heterocyclic organic radical, wherein the organic radicals are unsubstituted or substituted with heteroatoms.

Another embodiment of the present invention is the above formulation further comprising urethanes as plasticizers, Another embodiment of the present invention is the above formulation, wherein the urethanes are substituted with at least one fluorine atom.

Another embodiment of the present invention is the above formulation, wherein the urethanes have the general formula (IV)

where
o represents an integer from 1 to 8; and
$R^9$, $R^{10}$, $R^{11}$ represent, independently of one another, a substituent selected from the group consisting of hydrogen, a linear organic radical, a branched organic radical, a cyclic organic radical, and a heterocyclic organic radical, wherein the organic radicals are unsubstituted or substituted with heteroatoms.

Another embodiment of the present invention is the above formulation, wherein at least one of the radicals $R^9$, $R^{10}$, and/or $R^{11}$ is substituted with at least one fluorine atom.

Another embodiment of the present invention is the above formulation, wherein $R^9$ is an organic radical having at least one fluorine atom.

Yet another embodiment of the present invention is a process for producing exposed holographic media, which comprises producing a holographic medium from the above photopolymer formulation and exposing a hologram into the medium using electromagnetic radiation.

Another embodiment of the present invention is the above process, wherein the holographic media is selected from the group consisting of in-line holograms, off-axis holograms, full-aperture transfer holograms, white light transmission holograms, Denisyuk holograms, off-axis reflection holograms, edge-lit holograms, holographic stereograms.

DESCRIPTION OF THE INVENTION

We have found that a photopolymer formulation into which bright holograms quickly and simply perceivable by the unaided human eye can be exposed when the photoinitiator system contains a HABI, a dye attuned to the HABI and having an absorption maximum in the range of 400-800 nm and a hydrogen donor.

By HABI are herein meant derivatives of hexaarylbisimidazole. Compounds of this type are described for example in U.S. Pat. No. 3,652,275, U.S. Pat. No. 4,917,977 or U.S. Pat. No. 4,963,471. The compounds described there can be used in the photopolymer formulation of the present invention.

A hydrogen donor for the purposes of the present invention comprises compounds which readily undergo a homolytic bond cleavage into a hydrogen free radical and a possibly stabilized organic free radical of enhanced duration and minimal propensity for descendant reactions such as disintegration, dimerization or addition. Suitable hydrogen donors are described in U.S. Pat. No. 3,652,275, U.S. Pat. No. 4,917,977 or U.S. Pat. No. 4,963,471. The hydrogen donors described therein can be used in the photopolymer formulation of the present invention.

Chemically crosslinked matrix polymers are polymers wherein the individual chains of polymer are linked by covalent bonds to form a three-dimensional network.

The photopolymer formulations of the present invention provide bright holograms perceivable by the naked human eye. No post-processing of the photopolymers is required here, leading to a distinctly simplified way of producing volume holograms.

In a preferred embodiment, the HABI is a compound of formula (I)

where
$R^1$, $R^4$ are each independently a chlorine, a methoxy or an ethoxy radical and
$R^2$, $R^3$, $R^5$, $R^6$ are each independently one or more hydrogen, chlorine, methoxy and/or ethoxy radicals.

Such photopolymer formulations provide particularly bright holograms.

It is more preferable when $R^1$ and $R^4$ are each a chlorine radical and/or $R^2$, $R^3$, $R^5$, $R^6$ are each a hydrogen radical.

The hydrogen donor can be selected from the group consisting of alkylamine, alkylaminoalcohol, substituted glyine ester, aromatic or aliphatic thiol, aromatic or aliphatic amine, aromatic or benzylic disulphide, aromatic or benzylic diselenide.

It is particularly preferable when the hydrogen donor is 2-mercapto-1-methylimidazole, 1-phenyl-1H-tetrazole-5-thiol, mercaptobenzothiazole, phenyl disulphide, dodecanethiol, 2(3H)-benzoxazolethione, 1H-1,2,4-triazole-3-thiol, 5,5'-dithiobis-1-phenyl-1H-tetrazole, 1-methyl-1H-tetrazole-5-thiol, 5-methyl-1,3,4-thiadiazole-2-thiol, N-phenylglycine ethyl ester, N-phenylglycine methyl ester. It is also possible to use mixtures.

The chemically crosslinked matrix polymers may comprise polyurethanes in particular.

The matrix polymers may preferably comprise polyurethanes obtainable in particular by reaction of an isocyanate component a) with an isocyanate-reactive component b).

The isocyanate component a) preferably comprises polyisocyanates. As polyisocyanates there can be used any compounds known per se to a person skilled in the art, or mixtures thereof, which on average contain two or more NCO functions per molecule. These can be aromatic, araliphatic, aliphatic or cycloaliphatic based. Monoisocyanates and/or unsaturation-containing polyisocyanates can also be used, in minor amounts.

Suitable examples are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis(4,4'-isocyanatocyclohexyl)methane and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-tolylene diisocyanate, 1,5-naphthylene diisocyanate, 2,4'- or 4,4'-diphenylmethane diisocyanate and/or triphenylmethane 4,4',4"-triisocyanate.

It is likewise possible to use derivatives of monomeric di- or triisocyanates having urethane, urea, carbodiimide, acylurea, isocyanurate, allophanate, biuret, oxadiazinetrione, uretdione and/or iminooxadiazinedione structures.

Preference is given to using polyisocyanates based on aliphatic and/or cycloaliphatic di- or triisocyanates.

It is particularly preferable for the polyisocyanates of component a) to comprise di- or oligomerized aliphatic and/or cycloaliphatic di- or triisocyanates.

Very particular preference is given to isocyanurates, uretdiones and/or iminooxadiazinediones based on HDI and also 1,8-diisocyanato-4-(isocyanatomethyl)octane or mixtures thereof.

Likewise useful as component a) are NCO-functional prepolymers having urethane, allophanate, biuret and/or amide groups. Prepolymers of component a) are obtained in a well-known conventional manner by reacting monomeric, oligomeric or polyisocyanates a1) with isocyanate-reactive compounds a2) in suitable stoichiometry in the presence or absence of catalysts and solvents.

Useful polyisocyanates a1) include all aliphatic, cycloaliphatic, aromatic or araliphatic di- and triisocyanates known per se to a person skilled in the art, it being immaterial whether they were obtained by phosgenation or by phosgene-free processes. In addition, it is also possible to use the well-known conventional higher molecular weight descendant products of monomeric di- and/or triisocyanates having a urethane, urea, carbodiimide, acylurea, isocyanurate, allophanate, biuret, oxadiazinetrione, uretdione or iminooxadiazinedione structure each individually or in any desired mixtures among each other.

Examples of suitable monomeric di- or triisocyanates useful as component a1) are butylene diisocyanate, hexamethylene diisocyanate (HDI), isophorone diisocyanate (IPDI), trimethylhexamethylene diisocyanate (TMDI), 1,8-diisocyanato-4-(isocyanatomethyl)octane, isocyanatomethyl-1,8-octane diisocyanate (TIN), 2,4- and/or 2,6-toluene diisocyanate.

The isocyanate-reactive compounds a2) for constructing the prepolymers are preferably OH-functional compounds. These are analogous to the OH-functional compounds described hereinbelow for component b).

Preferred OH-functional compounds in a2) are polyester and/or polyether polyols having number average molar masses in the range from 200 to 6200 g/mol. Particular preference is given to difunctional polyether polyols based on ethylene glycol and propylene glycol, wherein the propylene glycol fraction comprises at least 40% by weight, and also polymers of tetrahydrofuran having number average molar masses in the range from 200 to 4100 g/mol and also aliphatic polyester polyols having number average molar masses in the range from 200 to 3100 g/mol.

Very particular preference is given to difunctional polyether polyols based on ethylene glycol and propylene glycol, wherein the propylene glycol fraction comprises at least 80% by weight (more particularly straight polypropylene glycols), and also polymers of tetrahydrofuran having number average molar masses in the range from 200 to 2100 g/mol. Very particular preference is similarly given to addition products of butyrolactone, $\epsilon$-caprolactone and/or methyl-$\epsilon$-caprolactone (more particularly $\epsilon$-caprolactone) onto aliphatic, araliphatic or cycloaliphatic di-, tri- or polyfunctional alcohols containing 2 to 20 carbon atoms (more particularly onto difunctional aliphatic alcohols having 3 to 12 carbon atoms). These addition products preferably have number average molar masses in the range from 200 to 2000 g/mol and more preferably in the range from 500 to 1400 g/mol.

Allophanates can also be used as a mixture with other prepolymers or oligomers of component a1). In these cases, the use of OH-functional compounds having functionalities of 1 to 3.1 is advantageous. In the use of monofunctional alcohols, those having 3 to 20 carbon atoms are preferred.

The use of amines for prepolymer preparation is also possible. For example, ethylenediamine, diethylenetriamine, triethylenetetramine, propylenediamine, diaminocyclohexane, diaminobenzene, diaminobisphenyl, difunctional polyamines, such as, for example, the Jeffamine®, amine-terminated polymers having number average molar masses of up to 10000 g/mol and any desired mixtures thereof with one another are suitable.

For the preparation of prepolymers containing biuret groups, isocyanate is reacted in excess with amine, a biuret group forming. All oligomeric or polymeric, primary or secondary, difunctional amines of the abovementioned type are suitable as amines in this case for the reaction with the di-, tri- and polyisocyanates mentioned. Aliphatic biurets based on aliphatic amines and aliphatic isocyanates are preferred. Low molecular weight biurets having number average molar masses of less than 2000 g/mol, based on aliphatic diamines or difunctional polyamines and aliphatic diisocyanates, in particular HDI and TMDI, are particularly preferred.

Preferred prepolymers are urethanes, allophanates or biurets obtained from aliphatic isocyanate-functional compounds and oligomeric or polymeric isocyanate-reactive compounds having number average molar masses of 200 to 10000 g/mol; urethanes, allophanates or biurets obtained from aliphatic isocyanate-functional compounds and polyols having number average molar masses of 200 to 6200 g/mol or (poly)amines having number average molar masses of less than 3000 g/mol are particularly preferred and allophanates obtained from HDI or TMDI and difunctional polyetherpolyols (in particular polypropylene glycols) having number average molar masses of 200 to 2100 g/mol, urethanes obtained from HDI or TMDI and based on adducts of butyrolactone, ε-caprolactone and/or methyl-ε-caprolactone (in particular ε-caprolactone) with aliphatic, araliphatic or cycloaliphatic di-, tri- or polyfunctional alcohols containing 2 to 20 carbon atoms (in particular with difunctional aliphatic alcohols having 3 to 12 carbon atoms), having number average molar masses of 500 to 3000 g/mol, particularly preferably of 1000 to 2000 g/mol (in particular as a mixture with other oligomers of difunctional aliphatic isocyanates) or urethanes obtained from HDI or TMDI and based on trifunctional polyetherpolyols (in particular polypropylene glycol) having number average molar masses between 2000 and 6200 g/mol and biurets obtained from HDI or TMDI with difunctional amines or polyamines having number average molar masses of 200 to 1400 g/mol (in particular also as a mixture with other oligomers of difunctional aliphatic isocyanates) are very particularly preferred.

The prepolymers described above preferably have residual contents of free monomeric isocyanate of less than 2% by weight, particularly preferably less than 1.0% by weight, very particularly preferably less than 0.5% by weight.

In addition to the prepolymers described, the isocyanate component can of course contain further isocyanate components proportionately. Aromatic, araliphatic, aliphatic and cycloaliphatic di-, tri- or polyisocyanates are suitable for this purpose. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate (TMDI), the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluene diisocyanate, 1,5-naphthylene diisocyanate, 2,4'- or 4,4'-diphenylmethane diisocyanate, triphenylmethane 4,4',4''-triisocyanate or derivatives thereof having a urethane, urea, carbodiimide, acylurea, isocyanurate, allophanate, biuret, oxadiazinetrione, uretdione or iminooxadiazinedione structure and mixtures thereof. Polyisocyanates based on oligomerized and/or derivatized diisocyanates which were freed from excess diisocyanate by suitable processes are preferred, in particular those of hexamethylene diisocyanate. The oligomeric isocyanurates, uretdiones and iminooxadiazinediones of HDI and mixtures thereof are particularly preferred.

It is optionally also possible for the isocyanate component a) proportionately to contain isocyanates, which are partially reacted with isocyanate-reactive ethylenically unsaturated compounds. α,β-Unsaturated carboxylic acid derivatives, such as acrylates, methacrylates, maleates, fumarates, maleimides, acrylamides, and vinyl ethers, propenyl ethers, allyl ethers and compounds which contain dicyclopentadienyl units and have at least one group reactive towards isocyanate are preferably used here as isocyanate-reactive ethylenically unsaturated compounds; these are particularly preferably acrylates and methacrylates having at least one isocyanate-reactive group. Suitable hydroxy-functional acrylates or methacrylates are, for example, compounds such as 2-hydroxyethyl (meth)acrylate, polyethylene oxide mono(meth)acrylates, polypropylene oxide mono(meth)acrylates, poly-alkylene oxide mono(meth)acrylates, poly(ε-caprolactone) mono(meth)acrylates, such as, for example, Tone® M100 (Dow, USA), 2-hydroxypropyl (meth)acrylate, 4-hydroxybutyl (meth)acrylate, 3-hydroxy-2,2-dimethylpropyl (meth)acrylate, the hydroxy-functional mono-, di- or tetra(meth)acrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol and industrial mixtures thereof. In addition, isocyanate-reactive oligomeric or polymeric unsaturated compounds containing acrylate and/or methacrylate groups, alone or in combination with the abovementioned monomeric compounds, are suitable. The proportion of isocyanates which are partly reacted with isocyanate-reactive ethylenically unsaturated compounds, based on the isocyanate component a), is 0 to 99%, preferably 0 to 50%, particularly preferably 0 to 25% and very particularly preferably 0 to 15%.

It is optionally also possible for the abovementioned isocyanate component a) to contain, completely or proportionately, isocyanates which are reacted completely or partially with blocking agents known to the person skilled in the art from coating technology. The following may be mentioned as an example of blocking agents: alcohols, lactams, oximes, malonic esters, alkyl acetoacetates, triazoles, phenols, imidazoles, pyrazoles and amines, such as, for example, butanone oxime, diisopropylamine, 1,2,4-triazole, dimethyl-1,2,4-triazole, imidazole, diethyl malonate, ethyl acetoacetate, acetone oxime, 3,5-dimethylpyrazole, ε-caprolactam, N-tert-butylbenzylamine, cyclopentanone carboxyethyl ester or any desired mixtures of these blocking agents.

In principle, all polyfunctional, isocyanate-reactive compounds which have on average at least 1.5 isocyanate-reactive groups per molecule can be used as component b).

In the context of the present invention, isocyanate-reactive groups are preferably hydroxyl, amino or thio groups, and hydroxy compounds are particularly preferred.

Suitable polyfunctional, isocyanate-reactive compounds are, for example, polyester-, polyether-, polycarbonate-, poly(meth)acrylate- and/or polyurethanepolyols.

In addition, aliphatic, araliphatic or cycloaliphatic di, tri or polyfunctional alcohols having a low molecular weight, i.e. having molecular weights of less than 500 g/mol and a short chain, i.e. containing 2 to 20 carbon atoms, are also suitable as polyfunctional, isocyanate-reactive compounds as constituents of component b).

These may be, for example, ethylene glycol, diethylene glycol, triethylene glycol, tetraethylene glycol, dipropylene glycol, tripropylene glycol, 1,2-propanediol, 1,3-propanediol, 1,4-butanediol, neopentyl glycol, 2-ethyl-2-butylpropanediol, trimethylpentanediol, positional isomers of diethyloctanediols, 1,3-butylene glycol, cyclohexanediol, 1,4-cyclohexanedimethanol, 1,6-hexanediol, 1,2- and 1,4-cyclohexanediol, hydrogenated bisphenol A (2,2-bis(4-hydroxycyclohexyl)propane), 2,2-dimethyl-3-hydroxypropionic acid (2,2-dimethyl-3-hydroxypropyl ester). Examples of suitable triols are trimethylolethane, trimethylolpropane or glycerol. Suitable higher-functional alcohols are ditrimethylolpropane, pentaerythritol, dipentaerythritol or sorbitol.

Suitable polyesterpolyols are, for example, linear polyesterdiols or branched polyesterpolyols, as are obtained in a known manner from aliphatic, cycloaliphatic or aromatic di- or polycarboxylic acids or their anhydrides with polyhydric alcohols having an OH-functionality of ≥2.

Examples of such di- or polycarboxylic acids or anhydrides are succinic, glutaric, adipic, pimelic, suberic, azelaic, sebacic, nonanedicarboxylic, decanedicarboxylic, terephthalic, isophthalic, o-phthalic, tetrahydrophthalic, hexahydrophthalic or trimellitic acid and acid anhydrides, such as o-phthalic, trimellitic or succinic anhydride or any desired mixtures thereof with one another.

Examples of such suitable alcohols are ethanediol, di-, tri- or tetraethylene glycol, 1,2-propanediol, di-, tri- or tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, trimethylolpropane, glycerol or any desired mixtures thereof with one another.

Preferred polyesterpolyols are based on aliphatic alcohols and mixtures of aliphatic and aromatic acids and have number average molar masses between 500 and 10000 g/mol and functionalities between 1.8 and 6.1.

Particularly preferred polyesterpolyols are based on aliphatic diols, such as butane-1,4-diol, hexane-1,6-diol, neopentyl glycol, ethanediol, propylene glycol, 1,3-butylene glycol, di-, tri- or polyethylene glycol, di-, tri- and/or tetrapropylene glycol or mixtures of abovementioned diols with aliphatic alcohols having a higher functionality, such as trimethylolpropane and/or pentaerythritol, the proportion of the alcohols having a higher functionality preferably accounting for less than 50 percent by weight (particularly less than 30 percent by weight), based on the total amount of the alcohol used, in combination with aliphatic di- or polycarboxylic acids or anhydrides, such as adipic acid and/or succinic acid or mixtures of abovementioned aliphatic polycarboxylic acids or anhydrides with aromatic polycarboxylic acids or anhydrides, such as terephthalic acid and/or isophthalic acid, the proportion of the aromatic polycarboxylic acids or anhydrides preferably accounting for less than 50 percent by weight (particularly less than 30 percent by weight), based on the total amount of the polycarboxylic acids or anhydrides used. Particularly preferred polyesterpolyols have number average molar masses between 1000 and 6000 g/mol and functionalities between 1.9 and 3.3.

The polyesterpolyols may also be based on natural raw materials, such as castor oil. It is also possible for the polyesterpolyols to be based on homo- or copolymers of lactones, as can preferably be obtained by an addition reaction of lactones or lactone mixtures in a ring-opening lactone polymerization, such as butyrolactone, $\epsilon$-caprolactone and/or methyl-$\epsilon$-caprolactone, with hydroxy-functional compounds, such as polyhydric alcohols having an OH-functionality of $\geq 2$ or polyols having a functionality of greater than 1.8, for example of the abovementioned type.

Preferred polyols which are used here as starters are polyetherpolyols having a functionality of 1.8 to 3.1 with number average molar masses of 200 to 4000 g/mol; poly(tetrahydrofurans) having a functionality of 1.9 to 2.2 and number average molar masses of 500 to 2000 g/mol (in particular 600 to 1400 g/mol) are particularly preferred. Adducts are butyrolactone, $\epsilon$-caprolactone and/or methyl-$\epsilon$-caprolactone and $\epsilon$-caprolactone is particularly preferred.

Such polyesterpolyols preferably have number average molar masses of 400 to 6000 g/mol, particularly preferably of 800 to 3000 g/mol. Their OH functionality is preferably 1.8 to 3.5, particularly preferably 1.9 to 2.2.

Suitable polycarbonatepolyols are obtainable in a manner known per se by reacting organic carbonates or phosgene with diols or diol mixtures.

Suitable organic carbonates are dimethyl, diethyl and diphenyl carbonate.

Suitable diols or mixtures comprise the polyhydric alcohols mentioned in connection with the polyester segments and having an OH functionality of $\geq 2$, preferably 1,4-butanediol, 1,6-hexanediol and/or 3-methylpentanediol, or polyesterpolyols can be converted into polycarbonatepolyols.

Such polycarbonatepolyols preferably have number average molar masses of 400 to 4000 g/mol, particularly preferably of 500 to 2000 g/mol. The OH functionality of these polyols is preferably 1.8 to 3.2, particularly preferably 1.9 to 3.0.

Suitable polyetherpolyols are polyadducts of cyclic ethers with OH- or NH-functional starter molecules, said polyadducts optionally having a block structure.

Suitable cyclic ethers are, for example, styrene oxides, ethylene oxide, propylene oxide, tetrahydrofuran, butylene oxide, epichlorohydrin and any desired mixtures thereof.

Starters which may be used are the polyhydric alcohols mentioned in connection with the polyesterpolyols and having an OH functionality of $\geq 2$ and primary or secondary amines and amino alcohols.

Preferred polyetherpolyols are those of the abovementioned type, exclusively based on propylene oxide or random or block copolymers based on propylene oxide with further 1-alkylene oxides, the proportion of 1-alkylene oxides being not higher than 80% by weight. Propylene oxide homopolymers and random or block copolymers which have oxyethylene, oxypropylene and/or oxybutylene units are particularly preferred, the proportion of the oxypropylene units, based on the total amount of all oxyethylene, oxypropylene and oxybutylene units, accounting for at least 20% by weight, preferably at least 45% by weight. Here, oxypropylene and oxybutylene comprise all respective linear and branched C3- and C4-isomers.

Such polyetherpolyols preferably have number average molar masses of 250 to 10000 g/mol, particularly preferably of 500 to 8500 g/mol and very particularly preferably of 600 to 4500 g/mol. The OH functionality is preferably 1.5 to 4.0, particularly preferably 1.8 to 3.1 and very particularly preferably 1.9 to 2.2.

Special polyetherpolyols which are preferably used are those which consist of an isocyanate-reactive component comprising hydroxy-functional multiblock copolymers of the $Y(X_i\text{---}H)_n$ type with i=1 to 10 and n=2 to 8 and number average molecular weights greater than 1500 g/mol, the $X_i$ segments being composed in each case of oxyalkylene units of the formula II $$\text{---CH2-CH(R)---O---} \qquad \qquad \text{(II)}$$

in which R is a hydrogen, alkyl or aryl radical which may also be substituted or may be interrupted by heteroatoms (such as ether oxygens), Y is a starter forming the basis, and the proportion of the $X_i$ segments, based on the total amount of the $X_i$ and Y segments, accounts for at least 50% by weight.

The outer blocks $X_i$ account for at least 50% by weight, preferably 66% by weight, of the total molar mass of $Y(X_i\text{---}H)_n$ and consist of monomer units which obey the formula II. In $Y(X_i\text{---}H)_n$, n is preferably a number from 2 to 6, particularly preferably 2 or 3 and very particularly preferably 2. In $Y(X_i\text{---}H)_n$, i is preferably a number from 1 to 6, particularly preferably from 1 to 3 and very particularly preferably 1.

In formula II, R is preferably a hydrogen, a methyl, butyl, hexyl or octyl group or an alkyl radical containing ether groups. Preferred alkyl radicals containing ether groups are those based on oxyalkylene units.

The multiblock copolymers $Y(X_i\text{---}H)_n$ preferably have number average molecular weights of more than 1200 g/mol, particularly preferably more than 1950 g/mol, but preferably not more than 12000 g/mol, particularly preferably not more than 8000 g/mol.

The $X_i$ blocks may be homopolymers of exclusively identical oxyalkylene repeating units. They may also be composed randomly of different oxyalkylene units or in turn be composed of different oxyalkylene units in a block structure.

Preferably, the $X_i$ segments are based exclusively on propylene oxide or random or blockwise mixtures of propylene oxide with further 1-alkylene oxides, the proportion of further 1-alkylene oxides being not higher than 80% by weight.

Particularly preferred segments $X_i$ are propylene oxide homopolymers and random or block copolymers which contain oxyethylene and/or oxypropylene units, the proportion of the oxypropylene units, based on the total amount of all oxyethylene and oxypropylene units, accounting for at least 20% by weight, particularly preferably 40% by weight.

As described further below, the $X_i$ blocks are added to an n-fold hydroxy- or amino-functional starter block $Y(H)_n$ by ring-opening polymerization of the alkylene oxides described above.

The inner block Y, which is present in an amount of less than 50% by weight, preferably less than 34% by weight, in $Y(X_i\text{—}H)_n$, consists of dihydroxy-functional polymer structures and/or polymer structures having a higher hydroxy-functionality, based on cyclic ethers, or is composed of dihydroxy-functional polycarbonate, polyester, poly(meth)acrylate, epoxy resin and/or polyurethane structural units and/or said structural units having a higher hydroxy functionality or corresponding hybrids.

Suitable polyesterpolyols are linear polyesterdiols or branched polyesterpolyols, as can be prepared in a known manner from aliphatic, cycloaliphatic or aromatic di- or polycarboxylic acids or their anhydrides, such as, for example, succinic, glutaric, adipic, pimelic, suberic, azelaic, sebacic, nonanedicarboxylic, decanedicarboxylic, terephthalic, isophthalic, o-phthalic, tetrahydrophthalic, hexahydrophthalic or trimellitic acid and acid anhydrides, such as o-phthalic, trimellitic or succinic anhydride, or any desired mixtures thereof with polyhydric alcohols, such as, for example, ethanediol, di-, tri- or tetraethylene glycol, 1,2-propanediol, di-, tri- or tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol or mixtures thereof, optionally with concomitant use of polyols having a higher functionality, such as trimethylolpropane or glycerol. Suitable polyhydric alcohols for the preparation of the polyesterpolyols are of course also cycloaliphatic and/or aromatic di- and polyhydroxy compounds. Instead of the free polycarboxylic acid, it is also possible to use the corresponding polycarboxylic anhydrides or corresponding polycarboxylic esters of lower alcohols or mixtures thereof for the preparation of the polyesters.

The polyesterpolyols may also be based on natural raw materials, such as castor oil. It is also possible for the polyesterpolyols to be based on homo- or copolymers of lactones, as can preferably be obtained by an addition reaction of lactones or lactone mixtures such as butyrolactone, ε-caprolactone and/or methyl-ε-caprolactone, with hydroxy-functional compounds, such as polyhydric alcohols having an OH functionality of preferably 2, for example of the abovementioned type.

Such polyesterpolyols preferably have number average molar masses of 200 to 2000 g/mol, particularly preferably of 400 to 1400 g/mol.

Suitable polycarbonatepolyols are obtainable in a manner known per se by reacting organic carbonates or phosgene with diols or diol mixtures.

Suitable organic carbonates are dimethyl, diethyl and diphenyl carbonate.

Suitable diols or mixtures comprise the polyhydric alcohols mentioned per se in connection with the polyesterpolyols and having an OH functionality of 2, preferably 1,4-butanediol, 1,6-hexanediol and/or 3-methylpentanediol. Polyesterpolyols may also be converted into polycarbonatepolyols. Dimethyl or diethyl carbonate is particularly preferably used in the reaction of said alcohols to give polycarbonatepolyols.

Such polycarbonatepolyols preferably have number average molar masses of 400 to 2000 g/mol, particularly preferably of 500 to 1400 g/mol and very particularly preferably of 650 to 1000 g/mol.

Suitable polyetherpolyols are polyadducts of cyclic ethers with OH- or NH-functional starter molecules, which polyadducts optionally have a block structure. For example, the polyadducts of styrene oxides, of ethylene oxide, propylene oxide, tetrahydrofuran, butylene oxide, epichlorohydrin, and their mixed adducts and graft products, and the polyetherpolyols obtained by condensation of polyhydric alcohols or mixtures thereof and the polyetherpolyols obtained by alkoxylation of polyhydric alcohols, amines and amino alcohols, may be mentioned as polyetherpolyols.

Suitable polymers of cyclic ethers are in particular polymers of tetrahydrofuran.

The polyhydric alcohols mentioned per se in connection with the polyesterpolyols, and primary or secondary amines and amino alcohols having an OH or NH functionality of 2 to 8, preferably 2 to 6, particularly preferably 2 to 3, very particularly preferably 2, may be used as starters.

Such polyetherpolyols preferably have number average molar masses of 200 to 2000 g/mol, particularly preferably of 400 to 1400 g/mol and very particularly preferably of 650 to 1000 g/mol.

The polymers of tetrahydrofuran are preferably employed as polyetherpolyols used for starters.

Of course, mixtures of the components described above can also be used for the inner block Y.

Preferred components for the inner block Y are polymers of tetrahydrofuran and aliphatic polycarbonatepolyols and polyesterpolyols and polymers of ε-caprolactone having number average molar masses of less than 3100 g/mol.

Particularly preferred components for the inner block Y are difunctional polymers of tetrahydrofuran and difunctional aliphatic polycarbonatepolyols and polyesterpolyols and polymers of ε-caprolactone having number average molar masses of less than 3100 g/mol.

Very particularly preferably, the starter segment Y is based on difunctional, aliphatic polycarbonatepolyols, poly(ε-caprolactone) or polymers of tetrahydrofuran having number average molar masses greater than 500 g/mol and less than 2100 g/mol.

Preferably used block copolymers of the structure $Y(X_i\text{—}H)_n$ comprise more than 50 percent by weight of the $X_i$ blocks described above and have a number average total molar mass of greater than 1200 g/mol.

Particularly preferred block copolyols consist of less than 50 percent by weight of aliphatic polyester, aliphatic polycarbonatepolyol or poly-THF and more than 50 percent by weight of the blocks $X_i$ described above as being according to the invention and have a number average molar mass of greater than 1200 g/mol. Particularly preferred block copolymers consist of less than 50 percent by weight of aliphatic polycarbonatepolyol, poly(ε-caprolactone) or poly-THF and more than 50 percent by weight of the blocks $X_i$ described above as being according to the invention and have a number average molar mass of greater than 1200 g/mol.

Very particularly preferred block copolymers consist of less than 34 percent by weight of aliphatic polycarbonate-polyol, poly(ε-caprolactone) or poly-THF and more than 66 percent by weight of the blocks $X_i$ described above as being according to the invention and have a number average molar mass of greater than 1950 g/mol and less than 9000 g/mol.

The block copolyols described are prepared by alkylene oxide addition processes. Firstly, the base-catalysed addition reaction of alkylene oxides with starter compounds having Zerewitinoff-active hydrogen atoms $Y(H)_n$ is of industrial importance and secondly the use of double metal cyanide compounds ("DMC catalysts") for carrying out this reaction is becoming increasingly important. Hydrogen bonded to N, O or S is designated as Zerewitinoff-active hydrogen (sometimes also only as "active hydrogen") if it provides methane by reaction with methylmagnesium iodide according to a process discovered by Zerewitinoff. Typical examples of compounds having Zerewitinoff-active hydrogen are compounds which contain carboxyl, hydroxyl, amino, imino or thiol groups as functional groups. The base-catalysed addition reaction of alkylene oxides, such as, for example, ethylene oxide or propylene oxide, with starter compounds having Zerewitinoff-active hydrogen atoms takes place in the presence of alkali metal hydroxides, but alkali metal hydrides, alkali metal carboxylates or alkaline earth metal hydroxides can also be used. After the addition reaction of the alkylene oxides is complete, the polymerization-active centres on the polyether chains must be deactivated, for example by neutralization with dilute mineral acids, such as sulphuric acid or phosphoric acid, and the removal of the resulting salts. In the process according to the invention, DMC catalysts are preferably used. Highly active DMC catalysts which are described, for example, in U.S. Pat. No. 5,470,813, EP-A 700 949, EP-A 743 093, EP-A 761 708, WO 97/40086, WO 98/16310 and WO 00/47649 are particularly preferably used. The highly active DMC catalysts which are described in EP-A 700 949 and, in addition to a double metal cyanide compound (e.g. zinc hexacyanocobaltate (III)) and an organic complex ligand (e.g. tert-butanol), also contain a polyether having a number average molecular weight greater than 500 g/mol are a typical example. Owing to their high activity, these catalysts can be used in such small amounts that further working-up of the polyetherpolyols is not required. The process is described in more detail below. The OH-functionalized precursor Y present in an amount of less than 50 percent by weight in the block copolymer is always used here as a "starter polyol", onto which the alkylene oxide is polymerized so that in the end a multiblock copolymer is obtained. Preferably used alkylene oxides are ethylene oxide, propylene oxide, butylene oxide and mixtures thereof. The synthesis of the polyether chains by alkoxylation can be carried out, for example, only with one monomeric epoxide or can also be effected randomly or blockwise with a plurality of different monomeric epoxides.

In a further preferred embodiment, the writing monomers comprise a mono- and/or a multifunctional writing monomer, comprising more particularly a mono- and/or a multifunctional acrylate. The use of these writing monomers and particularly of the writing monomer combination leads to a further increase in the brightness of the holograms.

In general, esters of acrylic acid and methacrylic acid are designated as acrylates and methacrylates, respectively. Examples of acrylates and methacrylates which can be used are methyl acrylate, methyl methacrylate, ethyl acrylate, ethyl methacrylate, ethoxyethyl acrylate, ethoxyethyl methacrylate, n-butyl acrylate, n-butyl methacrylate, tert-butyl acrylate, test-butyl methacrylate, hexyl acrylate, hexyl methacrylate, 2-ethylhexyl acrylate, 2-ethylhexyl methacrylate, butoxyethyl acrylate, butoxyethyl methacrylate, lauryl acrylate, lauryl methacrylate, isobornyl acrylate, isobornyl methacrylate, phenyl acrylate, phenyl methacrylate, p-chlorophenyl acrylate, p-chlorophenyl methacrylate, p-bromophenyl acrylate, p-bromophenyl methacrylate, 2,4,6-trichlorophenyl acrylate, 2,4,6-trichlorophenyl methacrylate, 2,4,6-tribromophenyl acrylate, 2,4,6-tribromophenyl methacrylate, pentachlorophenyl acrylate, pentachlorophenyl methacrylate, pentabromophenyl acrylate, pentabromophenyl methacrylate, pentabromobenzyl acrylate, pentabromobenzyl methacrylate, phenoxyethyl acrylate, phenoxyethyl methacrylate, phenoxyethoxyethyl acrylate, phenoxyethoxyethyl methacrylate, phenylthioethyl acrylate, phenylthioethyl methacrylate, 2-naphthyl acrylate, 2-naphthyl methacrylate, 1,4-bis(2-thionaphthyl)-2-butyl acrylate, 1,4-bis(2-thionaphthyl)-2-butyl methacrylate, propane-2,2-diylbis[(2,6-dibromo-4,1-phenylene)oxy(2-{[3,3,3-tris(4-chlorophenyl)-propanoyl]oxy}propane-3,1-diyl)oxyethane-2,1-diyl]diacrylate, bisphenol A diacrylate, bisphenol A dimethacrylate, tetrabromobisphenol A diacrylate, tetrabromobisphenol A dimethacrylate and the ethoxylated analogue compounds thereof, N-carbazolyl acrylates, to mention only a selection of acrylates and methacrylates which may be used.

It is further preferable when the acrylate has the general formula (III)

where m is ≥1 and in is ≤4 and $R^7$, $R^8$ are independently hydrogen, linear, branched, cyclic or heterocyclic organic radicals which are unsubstituted or optionally also substituted with heteroatoms.

Urethane acrylates may of course also be used. Urethane acrylates are understood as meaning compounds having at least one acrylic acid ester group which additionally have at least one urethane bond. It is known that such compounds can be obtained by reacting a hydroxy-functional acrylic acid ester with an isocyanate-functional compound.

Examples of isocyanate-functional compounds which can be used for this purpose are aromatic, araliphatic, aliphatic and cycloaliphatic di-, tri- or polyisocyanates. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluene diisocyanate, 1,5-naphthylene diisocyanate, 2,4'- or 4,4'-diphenylmethane diisocyanate, 1,5-naphthylene diisocyanate, m-methylthiophenyl isocyanate, triphenylmethane 4,4',4"-triisocyanate and tris(p-isocyanatophenyl) thiophosphate or derivatives thereof having a urethane, urea, carbodiimide, acylurea, isocyanurate, allophanate, biuret, oxadiazinetrione, uretdione or iminooxadiazinedione structure and mixtures thereof. Aromatic or araliphatic di-, tri- or polyisocyanates are preferred.

Suitable hydroxy-functional acrylates or methacrylates for the preparation of urethane acrylates are compounds such as 2-hydroxyethyl (meth)acrylate, polyethylene oxide mono (meth)acrylates, polypropylene oxide mono(meth)acrylates, polyalkylene oxide mono(meth)acrylates, poly(ε-caprolactone) mono(meth)acrylates, such as, for example, Tone® M100 (Dow, Schwalbach, Germany), 2-hydroxypropyl (meth)acrylate, 4-hydroxybutyl (meth)acrylate, 3-hydroxy-2,2-dimethylpropyl (meth)acrylate, hydroxypropyl (meth) acrylate, 2-hydroxy-3-phenoxypropyl acrylate, the hydroxy-functional mono-, di- or tetraacrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol or industrial mixtures thereof. 2-Hydroxyethyl acrylate, hydroxypropyl acrylate, 4-hydroxybutyl acrylate and poly(ε-caprolactone) mono(meth)acrylates are preferred. In addition, isocyanate-reactive oligomeric or polymeric unsaturated compounds containing acrylate and/or methacrylate groups, alone or in combination with the abovementioned monomeric compounds, are suitable. The epoxy (meth)acrylates known per se, containing hydroxyl groups and having OH contents of 20 to 300 mg KOH/g or polyurethane (meth) acrylates containing hydroxyl groups and having OH contents of 20 to 300 mg KOH/g or acrylated polyacrylates having OH contents of 20 to 300 mg KOH/g and mixtures thereof with one another and mixtures with unsaturated polyesters containing hydroxyl groups and mixtures with polyester (meth)acrylates or mixtures of unsaturated polyesters containing hydroxyl groups with polyester (meth)acrylates can likewise be used.

Preference is given particularly to urethane acrylates obtainable from the reaction of tris(p-isocyanatophenyl) thiophosphate and m-methylthiophenyl isocyanate with alcohol-functional acrylates such as hydroxyethyl (meth)acrylate, hydroxypropyl (meth)acrylate and hydroxybutyl (meth)acrylate.

It is similarly possible to add further unsaturated compounds such as α,β-unsaturated carboxylic acid derivatives such as acrylates, methacrylates, maleates, fumarates, maleimides, acrylamides, also vinyl ether, propenyl ether, allyl ether and dicyclopentadienyl-containing compounds and also olefinically unsaturated compounds such as, for example, styrene, α-methylstyrene, vinyltoluene, olefins, for example 1-octene and/or 1-decene, vinyl esters, (meth)acrylonitrile, (meth)acrylamide, methacrylic acid, acrylic acid as writing monomers.

The photopolymer formulation can moreover additionally contain urethanes as plasticizers, in which case the urethanes can be substituted with at least one fluorine atom in particular. It is particularly advantageous when the urethanes have the general formula (IV)

(IV)

where o is ≥1 and o is ≤8 and $R^9$, $R^{10}$, $R^{11}$ are independently hydrogen, linear, branched, cyclic or heterocyclic organic radicals which are unsubstituted or optionally also substituted with heteroatoms, wherein preferably at least one of the radicals $R^9$, $R^{10}$, $R^{11}$ is substituted with at least one fluorine atom and more preferably $R^9$ is an organic radical having at least one fluorine atom. Formulations of this kind lead to even brighter holograms.

The photopolymer formulation contains—as a sensitizer—one or more dyes whose absorption spectrum sufficiently coincides with the emission of the laser used for writing the hologram. The dye in effect has the function to absorb the energy of the light and to transmit it, via subsequent processes, to the HABI (R. Dessauer, Advances in Photochemistry (2005), 28, 129). It is to be noted that HABIs can change, not just in response to dyes but also in response to other external stimuli such as temperature or pressure, from the dimeric into the monomeric state and subsequently take part in or induce descendant reactions. Suitable dyes shall be selected from the classes of the aminotriarylmethanes, triarylmethanes, hydroquinone ethers, acridines, phenazines, phenothiazines, pyrenes, polymethines, diphenylmethanes, coumarins, subject to the proviso that the absorption maximum is positioned in the range of 400-800 nm.

Preferred dyes are Astrazon Orange G (Basic Orange 21) and/or ketocoumarin.

Further constituents of the photopolymer formulation can be: free-radical stabilizers, optionally catalysts or other excipient and adjuvant materials.

The photopolymer formulations of the present invention are useful in the manufacture of a holographic medium in the form of a film in particular. A layer of a material or assembly of materials which is transparent to light in the visible spectrum (transmission greater than 85% in the wavelength range from 400 to 780 nm), as a support, is coated one- or both-sidedly with a layer of the photopolymer formulation and, optionally, a covering layer is applied on top of the photopolymer layer or layers.

Preferred materials or assemblies of materials for the support are based on polycarbonate (PC), polyethylene terephthalate (PET), polybutylene terephthalate, polyethylene, polypropylene, cellulose acetate, cellulose hydrate, cellulose nitrate, cycloolefin polymers, polystyrene, polyepoxides, polysulphone, cellulose triacetate (CTA), polyamide, polymethyl methacrylate, polyvinyl chloride, polyvinyl butyral or polydicyclopentadiene or mixtures thereof. They are more preferably based on PC, PET and CTA. Assemblies of materials can be laminates of self-supporting polymeric sheets, or coextrudates. Preferred assemblies of materials are duplex and triplex films constructed according to one of the schemes A/B, A/B/A or A/B/C. Particular preference is given to PC/PET, PET/PC/PET and PC/TPU (TPU=thermoplastic polyurethane).

As an alternative to the abovementioned plastics support, it is also possible to use planar glass plates, which are used particularly for large-area accurately imaging exposures, for example for holographic lithography (Ng, Willie W.; Hong, Chi-Shain; Yariv, Amnon. Holographic interference lithography for integrated optics. IEEE Transactions on Electron Devices (1978), ED-25(10), 1193-1200, ISSN: 0018-9383).

The materials or assemblies of materials, of the support may have an anti-stick, antistatic, hydrophobic or hydrophilic finish on one or both sides. On the side facing the photopolymer layer, the modifications mentioned serve the purpose of making it possible to remove the photopolymer layer from the support non-destructively. A modification of that side of the support which faces away from the photopolymer layer serves to ensure that the media of the present invention meet specific mechanical requirements, for example in relation to processing in roll laminators, more particularly in roll-to-roll processes.

The present invention accordingly further provides for the use of a photopolymer formulation according to the invention in the manufacture of holographic media, more particularly in the manufacture of in-line holograms, off-axis holograms, full-aperture transfer holograms, white light transmission holograms, Denisyuk holograms, off-axis reflection holograms, edge-lit holograms and also holographic stereograms.

The invention finally also provides a process for producing exposed holographic media, which comprises producing a holographic medium from a photopolymer formulation according to any one of Claims 1 to 11 and exposing a hologram into the medium using electromagnetic radiation.

Possible optical functions of the holograms obtainable using the photopolymer formulations of the present invention can correspond to the optical functions of light elements such as lenses, mirrors, deflectors, filters, diffuser screens, diffraction elements, light conductors, waveguides, projection screens and/or masks. Frequently, these optical elements show a frequency selectivity, depending on how the holograms were exposed and on the dimensions of the hologram.

In addition, the photopolymer formulations of the present invention can also be used to produce holographic pictures or images, for example for personal portraits, biometric representations in security documents or generally of images or image structures for advertising, security labels, brand protection, branding, labels, design elements, decorations, illustrations, multi-journey tickets, images and the like and also images which can represent digital data, inter alia also in combination with the above-described products. Holographic images can give the impression of a three-dimensional image, but they may also represent image sequences, short films or a number of different objects, depending on the angle from which they are illuminated, the light source (including moving light source) with which they are illuminated, etc. It is because of these diverse design possibilities that holograms, more particularly volume holograms, constitute an attractive technical solution to the abovementioned application.

All the references described above are incorporated by reference in their entireties for all useful purposes.

While there is shown and described certain specific structures embodying the invention, it will be manifest to those skilled in the art that various modifications and rearrangements of the parts may be made without departing from the spirit and scope of the underlying inventive concept and that the same is not limited to the particular forms herein shown and described.

EXAMPLES

The examples which follow illustrate certain embodiments of the invention.
Starting Materials:
Isocyanate component 1 is a product of Bayer Material-Science AG, Leverkusen, Germany, full allophanate of hexane diisocyanate on polypropylene glycol having a number average molar mass of about 280 g/mol, NCO content: 16.5-17.3%.

Polyol 1 is an experimental product of Bayer Material-Science AG, Leverkusen, Germany, the preparation is described below.

DMC catalyst: double metal cyanide catalyst based on zinc hexacyanocobaltate (III), obtainable by the process described in EP-A 700 949.

Irganox 1076 is octadecyl 3,5-di-(tert)-butyl-4-hydroxy-hydrocinnamate (CAS 2082-79-3).

Acrylate 1 is an experimental product of Bayer Material-Science AG, Leverkusen, Germany, the preparation is described below.

Acrylate 2 is an experimental product of Bayer Material-Science AG, Leverkusen, Germany, the preparation is described below.

Additive 1 is an experimental product of Bayer Material-Science AG, Leverkusen, Germany, the preparation is described below.

Catalyst 1: urethanization catalyst, dimethylbis[(1-oxo-neodecyl)oxy]stannane, commercial product of Momentive Performance Chemicals, Wilton, Conn., USA (used as a 10% strength solution in N-ethylpyrrolidone).

Coinitiator 1 is 1H-imidazole-2-(2-chlorophenyl)-1-[2-(2-chlorophenyl)-4,5-diphenyl-2H-imidazol-2-yl]-4,5-biphenyl and was obtained from ABCR GmbH & Co. KG, Karlsruhe, Germany, (CAS: 7189-82-4).

Coinitiator 2 is 2-mercaptobenzoxazole and was obtained from Sigma-Aldrich Chemie GmbH, Steinheim, Germany, (CAS: 2382-96-9).

Dye 1 is ketocoumarin and was obtained from Acros Organics, New Jersey, USA, (CAS: 63226-13-1).

Dye 2 is Astrazon Orange G and was obtained from Sigma-Aldrich Chemie GmbH, Steinheim, Germany, (CAS: 3056-93-7).

Methods of Measurement:

The reported OH numbers were determined according to DIN 53240-2.

For the determination of the viscosity, the component or mixture to be investigated was applied at 20° C. in a cone-and-plate measuring system of a rheometer (from Anton Paar Physica, model MCR 51). The measurement is carried out under the following conditions:

Measuring body: cone CP 25, d=25 mm, angle=1°
Measuring gap as spacing between cone and plate: 0.047 mm
Duration of measurement: 10 sec
Determination of viscosity at a shear rate of 250 l/sec.

Measurement of the holographic properties DE and $\Delta n$ of the holographic media by means of two-beam interference in reflection arrangement.

The holographic media produced as described below was subsequently tested by means of a measuring arrangement according to FIG. 1 for their holographic properties as follows:

The beam of a diode-pumped solid-state laser from Newport, Model EXLSR-473-50-CDRH, was converted with the aid of the spatial filter (SF) and together with the collimation lens (CL) into a parallel homogeneous beam. The final cross sections of the signal and reference beam are established by the iris diaphragms (I). The diameter of the iris diaphragm opening is 0.4 cm. The polarization-dependent beam splitters (PBS) split the laser beam into two coherent identically polarized beams. Via the $\lambda/2$ plates, the power of the reference beam was adjusted to 1.55 mW and the power of the signal beam to 1.96 mW. The powers were determined using the semiconductor detectors (D) with sample removed. The angle of incidence ($\alpha_0$) of the reference beam is −22° and the angle of incidence ($\beta_0$) of the signal beam is 42°. The angles are measured starting from the sample normal to the beam direction. According to FIG. 1, $\alpha_0$ therefore has a negative sign and $\beta_0$ a positive sign. At the location of the sample (medium), the interference field of the two overlapping beams produced a grating of light and dark strips which are perpendicular to the angle bisectors of the two beams incident in the sample (reflection hologram). The strip spacing $\Lambda$, also referred to as grating period, in the medium is ~164 nm (the refractive index of the medium is assumed to be ~1.515).

Figure 1:
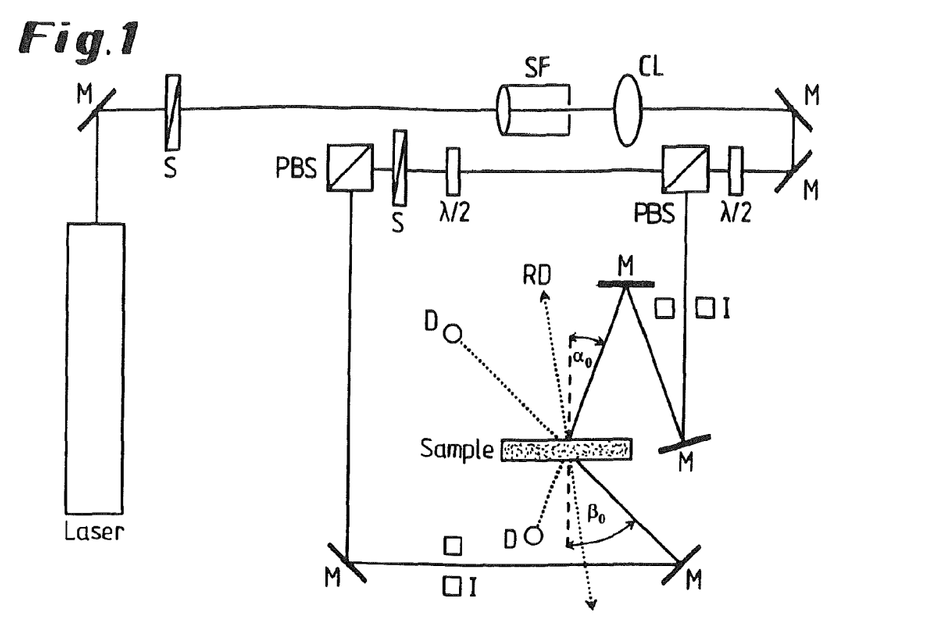
FIG. 1 illustrates a measuring arrangement for holographic properties.

FIG. 1 shows the geometry of a Holographic Media Tester (HMT) at λ=47.3 nm (diode-pumped solid body laser from Newport, model EXLSR-473-50-CDRH): M=mirror, S=shutter, SF=spatial filter, CL=collimator lens, λ/2=λ/2 plate, PBS=polarization-sensitive beam splitter, D=detector, I=iris diaphragm, $\alpha_0$=−22°, $\beta_0$=42° are the angles of incidence of the coherent beams, measured outside the sample (outside the medium). RD=reference direction of the turntable.

Holograms were recorded in the medium in the following manner:

Bolt shutters (S) are opened for the exposure time t.

Thereafter, with the closed shutters (S), the medium was allowed 5 minutes' time for the diffusion of the still unpolymerized writing monomers.

The recorded holograms were read in the following manner. The shutter of the signal beam remained closed. The shutter of the reference beam was opened. The iris diaphragm of the reference beam was closed to a diameter of <1 mm. This ensured that the beam was always completely in the previously recorded hologram for all angles (Ω) of rotation of the medium. The turntable, under computer control, covered the angle range from $\Omega_{min}$ to $\Omega_{max}$ with an angle step width of 0.05°. Ω is measured from the sample normal to the reference direction of the turntable. The reference direction of the turntable occurs when, during recording of the hologram, the angle of incidence of the reference beam and of the signal beam are of equal magnitude, i.e. $\alpha_0$=−32° and $\beta_0$= 32°. $\Omega_{recording}$ is then 0°. For $\alpha_0$=−22° and $\beta_0$=42°, $\Omega_{recording}$ is therefore 10°. The following is generally true for the interference field during recording of the hologram:

$$\alpha_0 = \theta_0 + \Omega_{recording}.$$

$\theta_0$ is the semiangle in the laboratory system outside the medium and the following is true during recording of the hologram:

$$\theta_0 = \frac{\alpha_0 - \beta_0}{2}.$$

In this case, $\theta_0$ is therefore −32°. At each angle Ω of rotation approached, the powers of the beam transmitted in the zeroth order were measured by means of the corresponding detector D and the powers of beam transmitted in the first order were measured by means of the detector D. At each angle Ω approached, the diffraction efficiency was obtained as the quotient of:

$$\eta = \frac{P_D}{P_D + P_T}$$

$P_D$ is the power in the detector of the diffracted beam and $P_T$ is the power in the detector of the transmitted beam.

By means of the method described above, the Bragg curve (describes the diffraction efficiency η as a function of the angle Ω of rotation of the recorded hologram) was measured and was stored in a computer. In addition, the intensity transmitted in the zeroth order was also plotted against the angle Ω of rotation and was stored in a computer.

The maximum diffraction efficiency (DE=$\eta_{max}$) of the hologram, i.e. its peak value, was determined at $\Omega_{reconstruction}$. For this purpose, the position of the detector of the refracted beam had to be changed, if necessary, in order to determine this maximum value.

The refractive index contrast Δn and the thickness d of the photopolymer layer were now determined by means of the Coupled Wave Theory (cf. H. Kogelnik, The Bell System Technical Journal, Volume 48, November 1969, Number 9, page 2909-page 2947) from the measured Bragg curve and the angle variation of the transmitted intensity. It should be noted that, owing to the thickness shrinkage occurring as a result of the photopolymerization, the strip spacing Λ' of the hologram and the orientation of the strips (slant) may deviate from the strip spacing Λ of the interference pattern and the orientation thereof. Accordingly, the $\alpha_0$' or the corresponding angle of the turntable $\Omega_{reconstruction}$ at which maximum diffraction efficiency is achieved will also deviate from $\alpha_0$ or from the corresponding $\Omega_{recording}$, respectively. As a result, the Bragg condition changes. This change is taken into account in the evaluation method. The evaluation method is described below:

all geometrical quantities which relate to the recorded hologram and not to the interference pattern are represented as quantities shown by dashed lines.

According to Kogelnik, the following is true for the Bragg curve η(Ω) of a reflection hologram:

$$\eta = \begin{cases} \dfrac{1}{1 - \dfrac{1-(\xi/\nu)^2}{\sin^2(\sqrt{\xi^2 - \nu^2})}}, & \text{for } \nu^2 - \xi^2 < 0 \\[2ex] \dfrac{1}{1 + \dfrac{1-(\xi/\nu)^2}{\sinh^2(\sqrt{\nu^2 - \xi^2})}}, & \text{for } \nu^2 - \xi^2 \geq 0 \end{cases}$$

with:

$$\nu = \frac{\pi \cdot \Delta n \cdot d'}{\lambda \cdot \sqrt{|c_s \cdot c_r|}}$$

$$\xi = -\frac{d'}{2 \cdot c_s} \cdot DP$$

$$c_s = \cos(\vartheta') - \cos(\psi') \cdot \frac{\lambda}{n \cdot \Lambda'}$$

$$c_r = \cos(\vartheta')$$

$$DP = \frac{\pi}{\Lambda'} \cdot \left(2 \cdot \cos(\psi' - \vartheta') - \frac{\lambda}{n \cdot \Lambda'}\right)$$

$$\psi' = \frac{\beta' + \alpha'}{2}$$

$$\Lambda' = \frac{\lambda}{2 \cdot n \cdot \cos(\psi' - \alpha')}$$

When reading the hologram ("reconstruction"), the situation is analogous to that described above:

$$\theta'_0 = \theta_0 + \Omega$$

$$\sin(\theta'_0) = n \cdot \sin(\theta')$$

Under the Bragg condition, the "dephasing" DP is 0. Accordingly, the following is true:

$$\alpha'_0 = \theta_0 + \Omega_{reconstruction}$$

$$\sin(\alpha'_0) = n \cdot \sin(\alpha')$$

The still unknown angle β' can be determined from the comparison of the Bragg condition of the interference field during recording of the hologram and the Bragg condition during reading of the hologram, assuming that only thickness shrinkage takes place. The following is then true:

$$\sin(\beta') = \frac{1}{n} \cdot [\sin(\alpha_0) + \sin(\beta_0) - \sin(\theta_0 + \Omega_{reconstruction})]$$

ν is the grating thickness, ξ is the detuning parameter and ψ' is the orientation (slant) of the refractive index grating which was recorded, α' and β' correspond to the angles $\alpha_0$ and $\beta_0$ of the interference field during recording of the hologram, but measured in the medium and applicable to the grating of the hologram (after thickness shrinkage). n is the mean refractive index of the photopolymer and was set at 1.504. λ is the wavelength of the laser light in vacuo.

The maximum diffraction efficiency (DE=$\eta_{max}$) for ξ=0 is then:

$$DE = \tanh^2(v) = \tanh^2\left(\frac{\pi \cdot \Delta n \cdot d'}{\lambda \cdot \sqrt{\cos(\alpha') \cdot \cos(\alpha' - 2\psi)}}\right)$$

Figure 2:
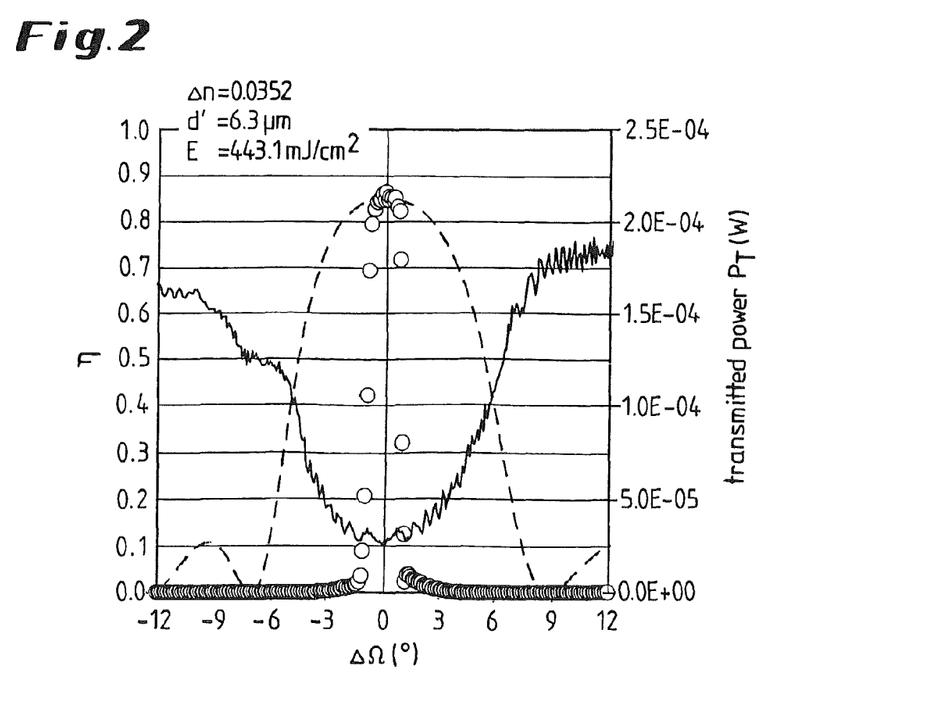
FIG. 2 illustrates a plot of the measured data of the diffraction efficiency, the theoretical Bragg curve, and the transmitted intensity plotted against the centred angle of rotation.

The measured data of the diffraction efficiency, the theoretical Bragg curve and the transmitted intensity are plotted against the centred angle of rotation $\Delta\Omega = \Omega_{reconstruction} - \Omega = \alpha'_0 - \theta'_0$, also referred to as angle detuning, as shown in FIG. 2.

Since DE is known, the shape of the theoretical Bragg curve according to Kogelnik is determined only by the thickness d' of the photopolymer layer. Δn is corrected via DE for a given thickness d' so that measurement and theory of DE always agree. d' is now adjusted until the full width at half maximum (FWHM) for the theoretical Bragg curve and for the transmitted intensity correspond.

Since the direction in which a reflection hologram rotates on reconstruction by means of an Ω scan, but the detector for diffracted light can detect only a finite angular range, the Bragg curve of broad holograms (small d') is not completely registered with an Ω scan, but only the central region, with suitable detector positioning. The shape of the transmitted intensity which is complementary to the Bragg curve is therefore additionally used for adjusting the layer thickness d'.

FIG. 2 shows the measured transmitted power $P_T$ (right y axis) as a solid line plotted against the angle of detuning ΔΩ, the measured diffraction efficiency η (left y axis) as solid circles plotted against the angle detuning ΔΩ (if permitted by the finite size of the detector) and the adaptation of the Kogelnik theory as a dashed line (left y axis).

For one formulation, this procedure was possibly repeated several times for different exposure times t on different media in order to determine at which mean energy dose of the incident laser beam during recording of the hologram DE the saturation value is reached. The mean energy dose E is obtained as follows from the powers of the two partial beams coordinated with the angles $\alpha_0$ and $\beta_0$ (reference beam with $P_r$=1.55 mW and signal beam with $P_S$=1.96 mW), the exposure time t and the diameter of the iris diaphragm (0.4 cm):

$$E(\text{mJ/cm}^2) = \frac{2 \cdot [P_r + P_s] \cdot t(s)}{\pi \cdot 0.4^2 \text{ cm}^2}$$

The powers of the partial beams were adjusted so that, at the angles $\alpha_0$ and $\beta_0$ used, the same power density is reached in the medium.

In examples, in each case the maximum value in Δn is reported.

Preparation of Components and Media

Preparation of Polyol 1:

A 20 l reaction tank equipped with a stirrer was charged with 2.48 kg of a difunctional polytetrahydrofuran polyether polyol (equivalent weight 325 g/mol of OH) followed by 452.6 mg of DMC catalyst. This is followed by heating to 105° C. with stirring at about 70 rpm. Air was exchanged for nitrogen by applying a vacuum and refilling with nitrogen three times. The stirrer speed was increased to 300 rpm and nitrogen was passed through the mixture from below for 57 minutes with the vacuum pump on, at a pressure of about 0.1 bar, Thereafter, a pressure of 0.5 bar was set by means of nitrogen and 100 g of ethylene oxide (EO) and 150 g of PO were introduced concurrently to start the polymerization. The pressure rose to 2.07 bar in the process. After 10 minutes, the pressure had fallen again to 0.68 bar, and a further 5.12 kg of EO in 7.56 kg of PO were introduced as a mixture at 2.34 bar over a period of 1 h 53 min, 31 minutes on completion of the epoxide dosing, the residual pressure was 2.16 bar and vacuum was applied and the system completely degassed. The product was stabilized by adding 7.5 g of Irganox 1076 and obtained as a slightly cloudy viscous liquid (OH number 27.1 mg KOH/g, viscosity at 25° C.; 1636 mPas).

Preparation of acrylate 1 (phosphorothioyltris(oxy-4, 1-phenyleneiminocarbonyloxyethane-2,1-diyl)triacrylate)

In a 500 ml round-bottom flask, 0.1 g of 2,6-di-tert-butyl-4-methylphenol, 0.05 g of dibutyltin dilaurate (Desmorapid® Z, Bayer MaterialScience AG, Leverkusen, Germany) and 213.07 g of a 27% strength solution of tris(p-isocyanatophenyl) thiophosphate in ethyl acetate (Desmodur® RFE, product of Bayer MaterialScience AG, Leverkusen, Germany) were initially introduced and heated to 60° C. Thereafter, 42.37 g of 2-hydroxyethyl acrylate were added dropwise and the mixture was further kept at 60° C. until the isocyanate content had fallen below 0.1%. Thereafter, cooling was effected and the ethyl acetate was completely removed in vacuo. The product was obtained as a semicrystalline solid.

Preparation of acrylate 2 2-({[3-(methylsulphanyl) phenyl]carbamoyl}oxy)ethyl prop-2-enoate)

In a 100 ml round-bottom flask, 0.02 g of 2,6-di-tert-butyl-4-methylphenol, 0.01 g of Desmorapid® Z, 11.7 g of 3-(methylthio)phenyl isocyanate were initially introduced and heated to 60° C. Thereafter, 8.2 g of 2-hydroxyethyl acrylate were added dropwise and the mixture was further kept at 60° C. until the isocyanate content had fallen below 0.1%. Cooling was then effected. The product was obtained as a light yellow liquid.

Preparation of additive 1: (bis(2,2,3,3,4,4,5,5,6,6,7,7-dodecafluoroheptyl)(2,2,4-trimethylhexane-1,6-diyl) biscarbamate)

A round-bottom flask was initially charged with 0.02 g of Desmorapid Z and 3.6 g of 2,4,4-trimethylhexane 1,6-diisocyanate, followed by heating to 70° C. Then, 11.39 g of 2,2,3,3,4,4,5,5,6,6,7,7-dodecafluoroheptan-1-ol were added dropwise and the mixture was maintained at 70° C. until the isocyanate content had dropped to below 0.1%. This was followed by cooling. The product was obtained as a colourless oil.

Example Medium 1

2.00 g of acrylate 1, 2.00 g of acrylate 2, 1.50 g of additive 1 were dissolved in 2.907 g of polyol 1 at 60° C. Then, 0.18 g of coinitiator 2 and 0.015 g of glass beads 10 μm in diameter were added. A solution of 0.03 g of coinitiator 1 and 0.015 g of dye 1 was mixed into 1.492 g of N-ethylpyrilidone in the dark to obtain a clear solution. The polyol solution described above was mixed in the dark with the just-described solution at about 35° C. This was followed by cooling to 30° C., addition of 0.367 g of isocyanate component 1 and 0.006 g of catalyst 1 and renewed mixing. The liquid mass obtained was then applied to a glass plate and there covered with a second glass plate, which was kept at a distance of 10 μm by the glass beads. This sample specimen was left to lie at room temperature and cured for 16 hours.

Example Medium 2

100 g of acrylate 1, 2.00 g of acrylate 2, 1.50 g of additive 1 were dissolved in 2.907 g of polyol 1 at 60° C. Then, 0.02 g of coinitiator 2 and 0.015 g of glass beads 10 μm in diameter were added. A solution of 0.27 g of coinitiator 1 and 0,015 g of dye 1 was mixed into 1.492 g of N-ethylpyrilidone in the dark to obtain a clear solution. The polyol solution described above was mixed in the dark with the just-described solution at about 35° C. This was followed by cooling to 30° C., addition of 0.367 g of isocyanate component 1 and 0.006 g of catalyst 1 and renewed mixing. The liquid mass obtained was then applied to a glass plate and there covered with a second glass plate, which was kept at a distance of 10 μm by the glass beads. This sample specimen was left to lie at room temperature and cured for 16 hours.

Example Medium 3

2.00 g of acrylate 1, 2.00 g of acrylate 2, 1.50 g of additive 1 were dissolved in 2.907 g of polyol 1 at 60° C. Then, 0.10 g of coinitiator 2 and 0.015 g of glass beads 10 μm in diameter were added. A solution of 0.15 g of coinitiator 1 and 0.015 g of dye 2 was mixed into 1.492 g of N-ethylpyrilidon in the dark to obtain a clear solution. The polyol solution described above was mixed in the dark with the just-described solution at about 35° C. This was followed by cooling to 30° C., addition of 0.367 g of isocyanate component 1 and 0.006 g of catalyst 1 and renewed mixing. The liquid mass obtained was then applied to a glass plate and there covered with a second glass plate, which was kept at a distance of 10 μm by the glass beads. This sample specimen was left to lie at room temperature and cured for 16 hours.

Note: Since different formulations having differing initial viscosity and differing curing rate for the matrix do not always lead to the same layer thicknesses d for the photopolymer layer, d is determined separately for each sample from the characteristics of the holograms written.

TABLE 1

Overview of example media 1-3

| Example | Δn | Total dose E [mJ/cm$^2$] |
|---|---|---|
| Medium 1 | 0.0352 | 100~850 |
| Medium 2 | 0.0200 | 200~1750 |
| Medium 3 | 0.0240 | 800~1750 |

The values observed for the dynamic range show that the photopolymers used in Example media 1 to 3 to produce holographic media are very suitable for visual holograms because of the high Δn value.

The invention claimed is:

1. A photopolymer formulation comprising a chemically crosslinked matrix polymer, a writing monomer, a urethane as plasticizer, wherein said urethane is of the formula (IV)

wherein
o is an integer of from 1 to 8; and
$R^9$, $R^{10}$, and $R^{11}$
are, independently of one another, a substituent selected from the group consisting of hydrogen, a linear organic radical, a branched organic radical, a cyclic organic radical, and a heterocyclic organic radical, wherein said organic radicals are optionally substituted with heteroatoms and wherein at least one of the radicals $R^9$, $R^{10}$, and/or $R^{11}$ is substituted with at least one fluorine atom,
and a photoinitiator system, wherein the photoinitiator system comprises an HABI, a dye attuned to the HABI and having an absorption maximum in the range of 400-800 nm, and a hydrogen donor.

2. The photopolymer formulation of claim 1, wherein the HABI is a compound of formula (I)

wherein
- $R^1$ and $R^4$ are, independently of one another, a substituent selected from the group consisting of chlorine, a methoxy, and ethoxy; and
- $R^2$, $R^3$, $R^5$, and $R^6$ are, independently of one another, a substituent selected from the group consisting of hydrogen, chlorine, methoxy, and ethoxy radicals.

3. The photopolymer formulation of claim 2, wherein $R^2$, $R^3$, $R^5$, $R^6$ are each hydrogen.

4. The photopolymer formulation of claim 1, wherein the hydrogen donor is selected from the group consisting of alkylamine, alkylaminoalcohol, substituted glycine ester, aromatic thiol, aliphatic thiol, aromatic amine, aliphatic amine, aromatic disulphide, benzylic disulphide, aromatic diselenide, and benzylic diselenide.

5. The photopolymer formulation of claim 1, wherein the hydrogen donor is selected from the group consisting of 2-mercapto-i-methylimidazole, 1-phenyl-1H-tetrazole-5-thiol, mercaptobenzothiazole, phenyl disulphide, dodecanethiol, 2(3H)-benzoxazolethione, 1H-1,2,4-triazole-3-thiol, 5,5'-dithiobis-1-phenyl-1H-tetrazole, 1-methyl-1H-tetrazole-5-thiol, 5-methyl-1,3,4-thiadiazole-2-thiol, N-phenylglycine ethyl ester, and N-phenylglycine methyl ester.

6. The photopolymer formulation of claim 1, wherein the chemically crosslinked matrix polymer is a polyurethane.

7. The photopolymer formulation of claim 1, wherein the writing monomer comprises a mono- and/or a multifunctional writing monomer.

8. The photopolymer formulation of claim 7, wherein the mono and/or multifunctional writing monomer comprises a mono- and/or a multifunctional acrylate.

9. The photopolymer formulation of claim 8, wherein the acrylate has the formula (III)

wherein
- m is an integer of from 1 to 4; and
- $R^7$ and $R^8$ is, independently of one another, a substituent selected from the group consisting of hydrogen, a linear organic radical, a branched organic radical, a cyclic organic radical, and a heterocyclic organic radical, wherein said organic radicals are optionally substituted with heteroatoms.

10. The photopolymer formulation of claim 1, wherein $R^9$ is an organic radical having at least one fluorine atom.

11. A process for producing exposed holographic media comprising the steps of producing a holographic medium from the photopolymer formulation of claim 1 and exposing a hologram into said holographic medium using electromagnetic radiation.

12. The process of claim 11, wherein the holographic media is selected from the group consisting of in-line holograms, off-axis holograms, full-aperture transfer holograms, white light transmission holograms, Denisyuk holograms, off-axis reflection holograms, edge-lit holograms, holographic stereograms.

* * * * *